United States Patent

Kang

[11] Patent Number: 6,112,156
[45] Date of Patent: Aug. 29, 2000

[54] APPARATUS AND METHOD FOR DETECTING ABNORMALITY OF MOTOR

[75] Inventor: Jun Hyok Kang, Seoul, Rep. of Korea

[73] Assignee: Samsung Electronics Co., Ltd., Suwon, Rep. of Korea

[21] Appl. No.: 08/892,167

[22] Filed: Jul. 14, 1997

[30] Foreign Application Priority Data

Aug. 20, 1996 [KR]  Rep. of Korea ............... 96-34530

[51] Int. Cl.[7] ............................................. G01L 3/26
[52] U.S. Cl. ........................................ 702/58; 702/64
[58] Field of Search ...................... 702/58, 57, 59, 702/64; 318/434

[56] References Cited

U.S. PATENT DOCUMENTS 5,412,295  5/1995  Maruyama et al. ................ 318/434

Primary Examiner—Tod R Swann
Assistant Examiner—Matthew Smithers
Attorney, Agent, or Firm—Burns, Doane, Swecker & Mathis, L.L.P.

[57] ABSTRACT

An abnormality detection apparatus and an abnormality detection method are provided. In a motor abnormality detection apparatus for detecting an abnormality of a motor, a current measurer measures the current flowing through the motor. A voltage measurer measures the voltage applied to the motor. A motor state detector detects the operation state of the motor. A current estimator estimates the current flowing through the motor based on the measured value of the voltage measurer and the detection result of the motor state detector. An abnormality detector detects an abnormality of the motor based on the measured value of the current measurer and the estimated value of the current estimator. The motor abnormality state detection method includes the steps of measuring the current flowing in the motor and the voltage applied to the motor; detecting the operation state of the motor, estimating the current flowing through the motor based on the measured voltage and the detected operation state, and detecting an abnormality of the motor based on the measured current and the estimated current. The abnormality detection apparatus and an abnormality detection method which can detect whether the current measurer itself operates abnormally to accurately detect an abnormality of the motor, and detect the abnormality of the motor due to the abnormality of the current measurer and the poor connection between the motor and the power source.

8 Claims, 2 Drawing Sheets

APPARATUS AND METHOD FOR DETECTING ABNORMALITY OF MOTOR

BACKGROUND OF THE INVENTION

The present invention relates to an apparatus for detecting an abnormality of a motor and a method for detecting an abnormality of a motor.

A servo drive measures the amount of current flowing through a motor and controls the motor for accurate control. The measured value of the current is effective data representing the state of a motor, and the measured value of the current and an actual position of the motor are data for calculating the actual torque of the motor. A conventional apparatus for detecting an abnormality of a motor using the amount of current flowing through the motor is shown in FIG. 2.

The conventional abnormality detection apparatus includes an overcurrent detection apparatus and an overload detection apparatus. The overcurrent detection apparatus includes a current measurer 51 and an overcurrent detector 55. The current measurer 51 having a Hall sensor measures the current flowing through a motor 40 when a predetermined voltage is applied to the motor 40. The output of the current measurer 51 is input to the overcurrent detector 55. The overcurrent detector 55 judges whether the motor 40 has a malfunction when the input current corresponds to a value which departs from the boundary of normal operation of the motor 40.

The overload detection apparatus includes an encoder 61, an encoder signal processor 63 and an abnormality detector 70. The encoder 61 encodes the information about the current states of the motor 40 such as the position and speed of the motor 40, and transmits the encoded information. The encoder signal processor 63 outputs the position of the motor 40 based on the coded signal. The abnormality detector 70 calculates an actual torque of the motor 40 based on data for the position of the motor 40 input from the encoder signal processor 63 and a measured current value of the current measurer 51. The abnormality detector 70 has data corresponding to when the motor 40 operates normally. The data is compared with the calculated torque to discriminate whether an abnormality of the operation of the motor 40 exists.

If the overcurrent detector 55 or the overload detector 70 detects and abnormality of the motor 40, a controller (not shown) for controlling the motor 40 stops the operation of the motor 40 or takes actions necessary therefor.

The conventional abnormality detection apparatus detects an abnormality of the motor 40 assuming that the current value measured in the current measurer 51 is accurate. Thus, when the current measurement is in error, an abnormality of the motor may not be detected. Accordingly, when the current measurement system malfunctions due to, e.g., errors in the connection of the current measurer 51 and the defects of the current measurer 51, the motor 40 and a servo drive can be damaged.

SUMMARY OF THE INVENTION

Therefore, to solve the above problems, it is an object of the present invention to provide an abnormality detection apparatus capable of preforming an accurate detection of an abnormality of a motor by detecting whether the current measurer itself operates abnormally. If the abnormality detection apparatus judges the current measurer to operate abnormally, it can still accurately detect an abnormality of a motor by using a current estimator based on an actual state of the motor.

It is another object of the present invention to provide an abnormality detection method for the above abnormality detection apparatus.

To accomplish the above object of the present invention, there is provided a motor abnormality detection apparatus for detecting an abnormality of a motor comprising: a current measurer for measuring the current flowing through the motor; a voltage measurer for measuring voltage applied to the motor; a motor state detector for detecting the operation state of the motor; a current estimator for estimating the current flowing through the motor based on the measured value of the voltage measurer and the detection result of the motor state detector; and an abnormality detector for detecting an abnormality of the motor based on the measured value of the current measurer and the estimated value of the current estimator.

Here, the motor state detector includes an encoder for encoding the operation state of the motor, an encoder signal processor for calculating the position and speed of the motor based on the output signal of the encoder, and the abnormality detector detects an abnormality of the motor by a difference between the measured value of the current measurer and the estimated value of the current estimator.

Also, the current estimator can be constructed to include an observer which is expressed by the following equation:

$$\frac{d}{dt}\begin{pmatrix}\hat{i}_d\\\hat{i}_q\end{pmatrix}=\begin{pmatrix}\dfrac{-R\hat{i}_d}{L}+\omega\hat{i}_q+\dfrac{V_d}{L}\\\dfrac{-R\hat{i}_q}{L}-\omega\hat{i}_d+\dfrac{V_q}{L}-\omega\dfrac{K_f}{L}\end{pmatrix}$$

in which R is a resistance of a motor coil, L is an inductance of the motor coil, $K_f$ is a counter-electromotive force constant, $\omega$ is an angular velocity of a motor rotor, $V_d$ and $V_q$ are voltages of d-q axis, $i_d$ and $i_q$ are currents of d-q axis, and a symbol ^ is an estimated value of a corresponding variable.

There is also provided a motor abnormality state detection method comprising the steps of: measuring the current flowing in the motor and the voltage applied to the motor; detecting the operation state of the motor; estimating the current flowing through the motor based on the measured voltage and the detected operation state; and detecting an abnormality of the motor based on the measured current and the estimated current.

Here, the detecting step of motor operation state includes the substeps of encoding the operation state of the motor, and calculating the position and speed of the motor based on the encoded signal, and the abnormality detection step is performed by obtaining a difference between the measured current value and the estimated current value.

Also, the current estimation can be done based on the observed result according to the following equation:

$$\frac{d}{dt}\begin{pmatrix}\hat{i}_d\\\hat{i}_q\end{pmatrix}=\begin{pmatrix}\dfrac{-R\hat{i}_d}{L}+\omega\hat{i}_q+\dfrac{V_d}{L}\\\dfrac{-R\hat{i}_q}{L}-\omega\hat{i}_d+\dfrac{V_q}{L}-\omega\dfrac{K_f}{L}\end{pmatrix}$$

in which R is a resistance of a motor coil, L is an inductance of the motor coil, $K_f$ is a counter-electromotive force constant, $\omega$ is an angular velocity of a motor rotor, $V_d$ and $V_q$ are voltages of d-q axis, $i_d$ and $i_q$ are currents of d-q axis, and a symbol ^ is an estimated value of a corresponding variable.

DETAILED DESCRIPTION OF THE PREFERRED EMBODIMENT OF THE INVENTION

An embodiment of the present invention will be described with reference to the drawings.

Figure 1:
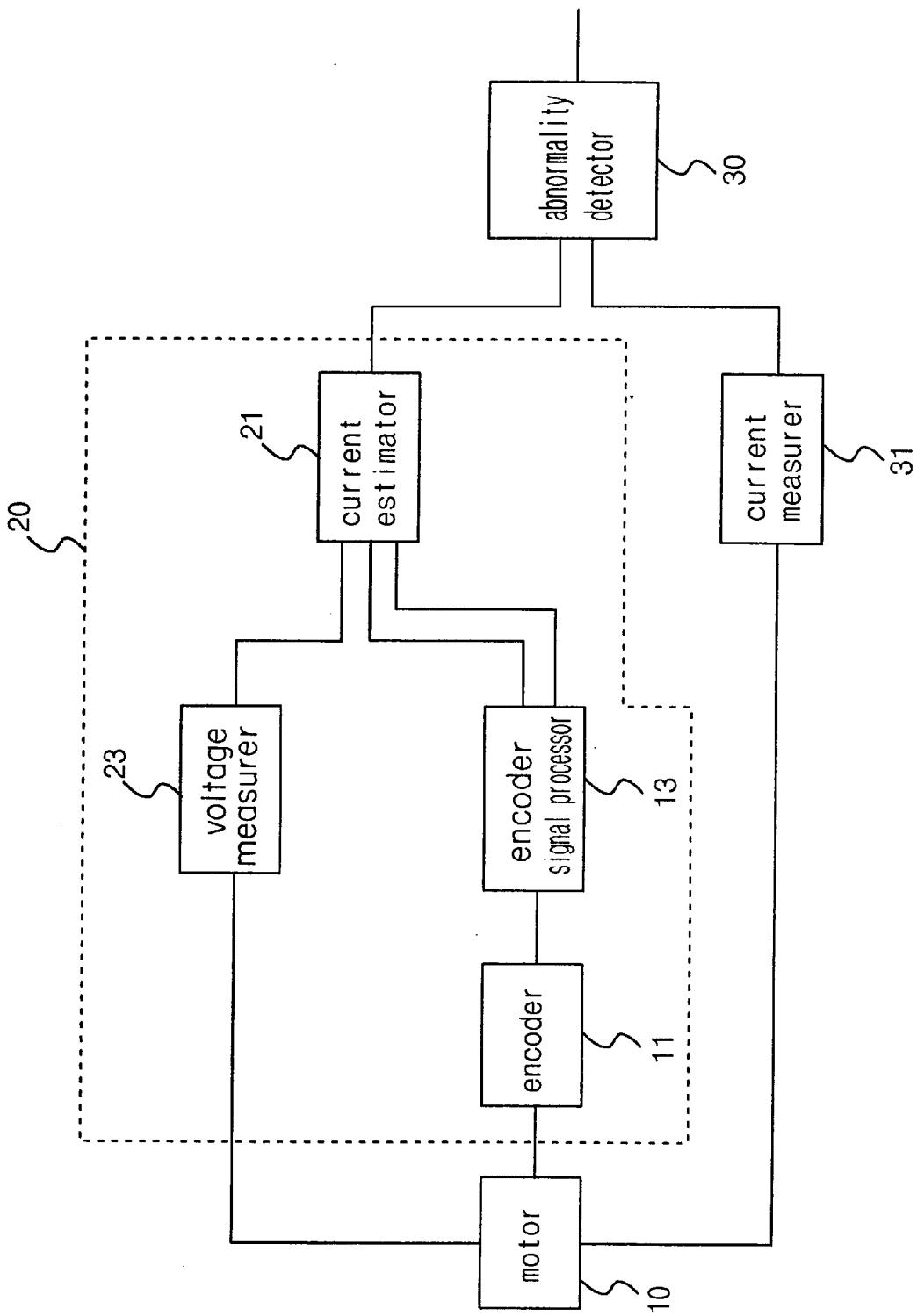
FIG. 1 is a block diagram of a motor abnormality detection apparatus according to the present invention.
Figure 2:
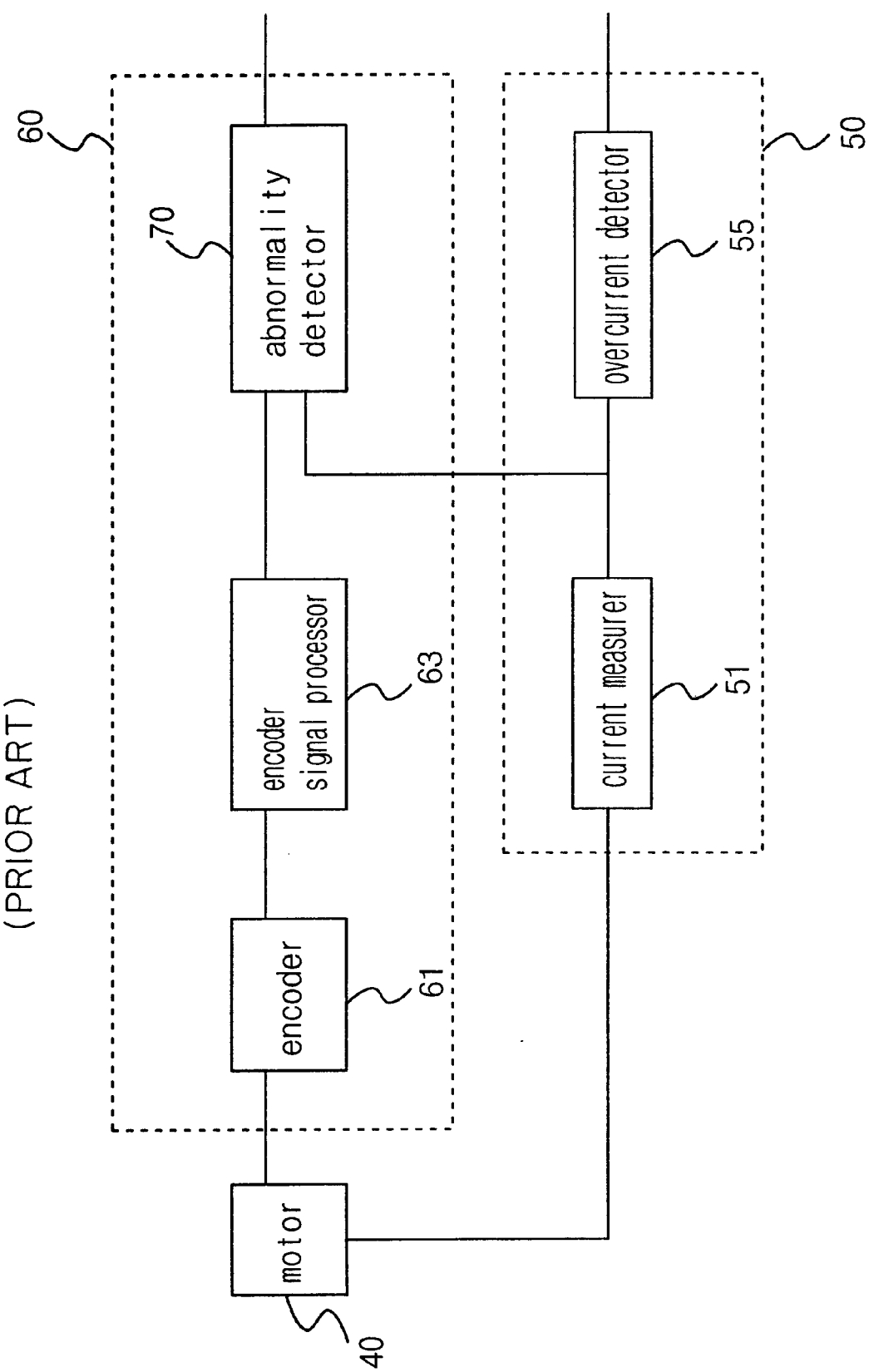
FIG. 2 is a block diagram of a conventional motor abnormality detection apparatus.

The abnormality detection apparatus of FIG. 1 includes a current estimation device 20 and an abnormality detector 30. The current estimation device 20 includes a voltage measurer 23 for measuring the voltage applied to a motor 10, an encoder 11 for encoding the position and speed according to the actual state of the motor 10 and outputting the encoded result, and an encoder signal processor 13 for analyzing the encoded signal from the encoder 11 and outputting the position and speed of the motor 10 which is output from the encoder 11. The voltage measured value output from the voltage measurer 23 and the position and speed of the motor 10 output from the encoder signal processor 13 are input to the current estimator 21. The current estimator 21 estimates the current flowing through the motor 10 based on the input data.

The current estimation is performed by the following description in the current estimator 21. First, the relationship between the voltage and current of the motor is obtained by the following equation (1) on a d-q axis.

$$\frac{d}{dt}\begin{pmatrix} i_d \\ i_q \end{pmatrix} = \begin{pmatrix} \frac{-Ri_d}{L} + \omega i_q + \frac{V_d}{L} \\ \frac{-Ri_q}{L} - \omega i_d + \frac{V_q}{L} - \omega \frac{K_f}{L} \end{pmatrix} \quad (1)$$

in which R is a resistance of a motor coil, L is an inductance of the motor coil, $K_f$ is a counter-electromotive force constant, $\omega$ is an angular velocity of a motor rotor, $V_d$ and $V_q$ are voltages of d-q axis, $i_d$ and $i_q$ are currents of d-q axis.

The resistance, the inductance and the counter-electromotive force constant are set by a motor manufacturer, and the angular velocity of the motor rotor and the voltage can be measured. The current flowing through the motor can be easily obtained by solving the dynamic equation (1). However, since the method for calculating the current by solving the equation (1) is complex, an observer is used, which follows.

$$\frac{d}{dt}\begin{pmatrix} \hat{i}_d \\ \hat{i}_q \end{pmatrix} = \begin{pmatrix} \frac{-R\hat{i}_d}{L} + \omega \hat{i}_q + \frac{V_d}{L} \\ \frac{-R\hat{i}_q}{L} - \omega \hat{i}_d + \frac{V_q}{L} - \omega \frac{K_f}{L} \end{pmatrix} \quad (2)$$

Here, each variable is same as that of equation (1) and a symbol ^ is an estimated value of a corresponding variable.

An equation (3) for calculating an estimated error can be obtained by subtracting the equation (2) from equation (1).

$$\frac{d}{dt}\begin{pmatrix} e_d \\ e_q \end{pmatrix} = \begin{pmatrix} -\frac{R}{L} & \omega \\ -\omega & -\frac{R}{L} \end{pmatrix}\begin{pmatrix} e_d \\ e_q \end{pmatrix} \quad (3)$$

Using the Lyapnov function, convergency of the current estimation can be verified from equation (3) of the estimated error.

If a d-q axis current is obtained by equation (2), the current of the UVW phases can be obtained by the following relationship.

$$\hat{i}_u = -\hat{i}_q \sin\theta \quad (4a)$$

$$\hat{i}_v = -\hat{i}_q \sin\left(\theta - \frac{2\pi}{3}\right) \quad (4b)$$

$$\hat{i}_w = -\hat{i}_q \sin\left(\theta + \frac{2\pi}{3}\right) \quad (4c)$$

The current measurer 31 includes a Hall sensor and measures the current flowing in the motor 10 when a predetermined voltage is applied to the motor 10 for its operation.

The abnormality detector 30 compares the estimated current value obtained by the above equations 4a–4c with the measured current value from the current measurer 31 to obtain an error value therebetween. The abnormality detector 30 judges that the motor 10 is operating abnormally when the error value is a predetermined value or more, and outputs a signal to notify operators of the abnormality. The abnormality detection apparatus estimates the voltage applied to the motor 10 and the current flowing in the motor 10 based on the actual position and speed during a driving of the motor 10, thereby easily discriminating an abnormality of the current measurer 31 itself.

Also, if the difference between the estimated current value and the measured current value is within the boundary of a normal error, it can be judged that the current measurer 31 is operating normally and without any abnormality. In this case, the abnormality detector 30 outputs a signal to notify the state of overcurrent or overload of the motor when the estimated current value and the measured current value exceed the current value which is proper to drive the motor.

The abnormality detection apparatus according to the present invention can detect whether the measured value output from the current measurer 31 differs from the estimated value output from the current estimator 21. Further, the present invention can be applied as a detection apparatus for detecting inferiority of connection between a power supply and the motor 10, inferiority of connection of the current measurer 31, and an abnormality of a servo drive power device. Also, the present invention can be used in sensing an abnormality of the components for measuring the current in the current measurer 31 which directly measures the current of the motor 10.

As described above, the present invention provides an abnormality detection apparatus and an abnormality detection method which can detect whether the current measurer itself operates abnormally to accurately detect an abnormality of the motor, and detect an abnormality of the motor due to an abnormality of the current measurer and a poor connection between the motor and the power source.

The present invention has been described by way of exemplary embodiments to which it is not limited. Variations and modifications will occur to those skilled in the art without departing from the spirit and scope of the present invention as defined in the claims appended hereto.

What is claimed is:

1. A motor abnormality detection apparatus for detecting an abnormality of a motor, comprising:
   a current measurer for measuring current flowing through said motor;
   a voltage measurer for measuring voltage applied to said motor;
   a motor state detector for detecting an operation state of said motor;
   a current estimator for estimating current flowing through said motor based on the measured value of said voltage measurer and the detection result of said motor state detector; and
   an abnormality detector for detecting abnormalities of said motor based on the measured value of said current measurer and the estimated value of said current estimator;
   wherein said current estimator includes means for using an observer which is expressed by the following equation:

$$\frac{d}{dt}\begin{pmatrix}\hat{i}_d\\\hat{i}_q\end{pmatrix}=\begin{pmatrix}\dfrac{-R\hat{i}_d}{L}+\omega\hat{i}_q+\dfrac{V_d}{L}\\\dfrac{-R\hat{i}_q}{L}-\omega\hat{i}_d+\dfrac{V_q}{L}-\omega\dfrac{K_f}{L}\end{pmatrix}$$

in which R is a resistance of a motor coil, L is an inductance of the motor coil, $K_f$ is a counter-electromotive force constant, $\omega$ is an angular velocity of a motor rotor, $V_d$ and $V_q$ are voltages of d-q axis, $i_d$ and $i_q$ are currents of d-q axis, and a symbol ^ is an estimated value of a corresponding variable.

2. The motor abnormality detection apparatus according to claim 1, wherein said motor state detector includes an encoder for encoding the operation state of said motor, an encoder signal processor for calculating the position and speed of said motor based on the output signal of said encoder.

3. The motor abnormality detection apparatus according to claim 1, wherein said abnormality detector detects an abnormality of said motor based on a difference between the measured value of said current measurer and the estimated value of said current estimator.

4. The motor abnormality detection apparatus according to claim 2, wherein said abnormality detector detects an abnormality of said motor based on a difference between the measured value of said current measurer and the estimated value of said current estimator.

5. A motor abnormality state detection method comprising the steps of:
   measuring current flowing in said motor and the voltage applied to said motor;
   detecting an operation state of said motor;
   estimating current flowing through said motor based on the measured voltage and the detected operation state; and
   detecting an abnormality of said motor based on the measured current and the estimated current;
   wherein said current estimating step includes calculating a result obtained by the following equation:

$$\frac{d}{dt}\begin{pmatrix}\hat{i}_d\\\hat{i}_q\end{pmatrix}=\begin{pmatrix}\dfrac{-R\hat{i}_d}{L}+\omega\hat{i}_q+\dfrac{V_d}{L}\\\dfrac{-R\hat{i}_q}{L}-\omega\hat{i}_d+\dfrac{V_q}{L}-\omega\dfrac{K_f}{L}\end{pmatrix}$$

in which R is a resistance of a motor coil, L is an inductance of the motor coil, $K_f$ is a counter-electromotive force constant, $\omega$ is an angular velocity of a motor rotor, $V_d$ and $V_q$ are voltages of d-q axis, $i_d$ and $i_q$ are currents of d-q axis, and a symbol ^ is an estimated value of a corresponding variable.

6. The motor abnormality state detection method according to claim 5, wherein said motor operation state detecting step includes the substeps of encoding the operation state of said motor, and calculating the position and speed of said motor based on the encoded signal.

7. The motor abnormality state detection method according to claim 5, wherein said abnormality detecting step includes obtaining a difference between the measured value and the estimated value.

8. The motor abnormality state detection method according to claim 6, wherein said abnormality detecting step includes obtaining a difference between the measured value and the estimated value.

* * * * *